(12) United States Patent
Xiao

(10) Patent No.: US 10,608,013 B1
(45) Date of Patent: Mar. 31, 2020

(54) 3D MEMORY DEVICE AND METHOD FOR FORMING 3D MEMORY DEVICE

(71) Applicant: Yangtze Memory Technologies Co., Ltd., Wuhan, Hubei Province (CN)

(72) Inventor: Li Hong Xiao, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/170,047

(22) Filed: Oct. 25, 2018

Related U.S. Application Data

(63) Continuation of application No. PCT/CN2018/107656, filed on Sep. 26, 2018.

(51) Int. Cl.
| | | |
|---|---|---|
| *G11C 5/06* | (2006.01) | |
| *H01L 27/11582* | (2017.01) | |
| *H01L 27/11519* | (2017.01) | |
| *H01L 27/11548* | (2017.01) | |
| *H01L 27/11565* | (2017.01) | |
| *H01L 27/11575* | (2017.01) | |
| *G11C 16/04* | (2006.01) | |
| *H01L 27/11556* | (2017.01) | |

(52) U.S. Cl.
CPC ......... *H01L 27/11582* (2013.01); *G11C 5/06* (2013.01); *G11C 16/0483* (2013.01); *H01L 27/11519* (2013.01); *H01L 27/11548* (2013.01); *H01L 27/11556* (2013.01); *H01L 27/11565* (2013.01); *H01L 27/11575* (2013.01)

(58) Field of Classification Search
CPC ......... H01L 27/11582; H01L 27/11556; H01L 27/11519; H01L 27/11575; H01L 27/11565; H01L 27/11548; G11C 5/06; G11C 16/0483
See application file for complete search history.

(56) References Cited

U.S. PATENT DOCUMENTS

| | | | |
|---|---|---|---|
| 2014/0016408 A1 | 1/2014 | Lee | |
| 2014/0306279 A1* | 10/2014 | Park | H01L 29/7889 257/314 |
| 2016/0163686 A1 | 6/2016 | Lee | |
| 2017/0358590 A1* | 12/2017 | Kang | H01L 27/11575 |
| 2018/0226423 A1 | 8/2018 | Kang | |

FOREIGN PATENT DOCUMENTS

| | | |
|---|---|---|
| CN | 103594475 A | 2/2014 |
| CN | 104319276 A | 1/2015 |
| CN | 104396004 A | 3/2015 |
| CN | 108565266 A | 9/2018 |

* cited by examiner

*Primary Examiner* — Mohammed A Bashar
(74) *Attorney, Agent, or Firm* — Winston Hsu

(57) ABSTRACT

A method for forming 3D memory device includes forming an alternating dielectric stack in a contact region on a substrate, forming a plurality of contact holes with various depths vertically extending in the alternating dielectric stack, forming a sacrificial-filling layer to fill the contact holes, forming a plurality of dummy channel holes penetrating the alternating dielectric stack in the contact region, filling the dummy channel holes with a dielectric material to form supporters, and replacing the sacrificial layers of the alternating dielectric stack and the sacrificial-filling layer with conductive layers so as to form a plurality of gate lines and contacts.

25 Claims, 14 Drawing Sheets

3D MEMORY DEVICE AND METHOD FOR FORMING 3D MEMORY DEVICE

CROSS REFERENCE TO RELATED APPLICATIONS

This application is a continuation of International Application No. PCT/CN2018/107656 filed on Sep. 26, 2018, which is incorporated herein by reference in its entirety.

BACKGROUND OF THE INVENTION

1. Field of the Invention

Embodiments of the present disclosure relate to three-dimensional (3D) memory devices and related formation methods.

2. Description of the Prior Art

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array. In conventional 3D memory architecture, staircase formation needs dedicate reticles and lithography/etching processes, which significantly increased cost and decreased productive throughput. In addition, contacts in the staircase structure needs to be formed in one or more masking-etching processes to form gradually form increased depth. However, defects may occur which are caused by process inaccuracy, such as over-etching, under-etching, and misalignment of contact holes. To maintain consistent critical dimension (CD) and alignment of the staircase and contacts is also a challenge in the formation of the staircase structure.

SUMMARY OF THE INVENTION

Embodiments of 3D memory devices and methods for forming 3D memory devices are disclosed herein.

Disclosed is a method for forming a three-dimensional (3D) memory device, comprising: forming an alternating dielectric stack in a contact region on a substrate, wherein the alternating dielectric stack includes a plurality of dielectric layers and a plurality of sacrificial layers alternately stacked in a vertical direction that is perpendicular to a surface of the substrate; forming a plurality of contact holes with various depths vertically extending in the alternating dielectric stack, wherein the depths of the plurality of contact holes are gradually increased from a first boundary of the contact region toward a second boundary of the contact region; forming a sacrificial-filling layer to fill the contact holes; forming a plurality of dummy channel holes penetrating the alternating dielectric stack in the contact region; filling the dummy channel holes with a dielectric material to form supporters; and replacing the sacrificial layers and the sacrificial-filling layer with conductive layers so as to form a plurality of gate lines and contacts.

In some embodiments, forming the plurality of contact holes with various depths comprises: forming a hard mask with a plurality of openings on the alternating dielectric stack; forming a photoresist layer on the hard mask; patterning the photoresist layer to expose a portion of the hard mask and one of the openings of the hard mask; performing a selectively etching process to the alternating dielectric stack by taking the photoresist layer and the exposed portion of the hard mask as an etching mask; and performing a plurality of trim-etch cycles by trimming the photoresist layer and etching the plurality of dielectric layers and sacrificial layers through the openings of the hard mask.

In some embodiments, performing the plurality of trim-etch cycles comprises: trimming the photoresist layer to broaden an exposed portion of the hard mask and to expose a further opening of the hard mask; performing an alternating high selectively etching process to the alternating dielectric stack by taking the trimmed photoresist layer and the exposed portion of the hard mask as an etching mask; and repeating the plurality of trim-etch cycles composed of trimming the photoresist layer and performing the alternating high selectively etching process to the alternating dielectric stack until the bottom sacrificial layer is exposed.

In some embodiments, the alternating dielectric stack includes N+1 layers of the dielectric layer and N layers of the sacrificial layers, and the hard mask has a number N of the openings.

In some embodiments, numbers of the plurality of dielectric layers penetrated by the plurality of contact holes with various depths are gradually increased from the first boundary of the contact region toward the second boundary of the contact region.

In some embodiments, when forming the plurality of contact holes, the plurality of dielectric layers and the plurality of sacrificial layers have same lengths along a lateral direction from the first boundary of the contact region toward the second boundary of the contact region.

In some embodiments, replacing the sacrificial layers and the sacrificial-filling layer with the conductive layers comprises: removing the sacrificial layers and the sacrificial-filling layer to form a plurality of gaps between the plurality of dielectric layers and the supporters, wherein the plurality of gaps have a plurality of top openings; and filling a conductive material into the plurality of gaps downward through the plurality of top openings.

In some embodiments, the method for forming the 3D memory device further includes forming a high-K layer, a glue layer, and/or a barrier layer on surfaces of the plurality of gaps before filling the conductive material into the plurality of gaps.

In some embodiments, replacing the sacrificial layers and the sacrificial-filling layer with the conductive layers comprises: forming a gate line slit in the core array region, wherein the gate line slit vertically extends through the alternating dielectric stack to the substrate; removing the sacrificial layers and the sacrificial-filling layer to form a plurality of gaps between the plurality of dielectric layers and the supporters; and filling a conductive material into the plurality of gaps through the gate line slit laterally.

In some embodiments, one of the plurality of dummy channel holes is disposed between two of the plurality of contact holes adjacent to each other.

In some embodiments, a bottom portion of each of the plurality of dummy channel holes is lower than the surface of the substrate.

In some embodiments, the method for forming the 3D memory device further includes forming a plurality of channel holes penetrating the alternating dielectric stack in a core array region of the substrate after forming the sacrificial-filling layer.

In some embodiments, the plurality of channel holes and the plurality of dummy channel holes are formed simultaneously.

In some embodiments, a memory string is formed in each of the plurality of channel holes.

In some embodiments, a gate line slit structure is further formed in the core array region.

In some embodiments, the substrate includes a first-type deep well and a second-type well on the first-type deep well.

A 3D memory device is disclosed. The 3D memory device includes a substrate having a contact region and a core array region; an alternating conductor/dielectric stack disposed on the substrate, wherein the alternating conductor/dielectric stack includes a plurality of word lines extending laterally from the core array region to the contact region; a plurality memory strings penetrating the alternating conductor/dielectric stack in the core array region; and a plurality of contacts with various heights extending vertically in the alternating conductor/dielectric stack and in the contact region, wherein a number of the plurality of word lines electrically connected to one of the plurality of contacts is different from a number of the plurality of word lines electrically connected to another one of the plurality of contacts.

A 3D memory device is disclosed. The 3D memory device includes a substrate having a contact region and a core array region; an alternating conductor/dielectric stack disposed on the substrate, wherein the alternating conductor/dielectric stack includes a plurality of word lines extending laterally from the core array region to the contact region; a plurality memory strings penetrating the alternating conductor/dielectric stack in the core array region; and a plurality of contacts with various heights extending vertically in the alternating conductor/dielectric stack and in the contact region to pass through one or more of the plurality of word lines, wherein each of the plurality of contacts is electrically connected to one or more of the plurality of word lines that are passed through by the contact.

In some embodiments, the plurality of word lines have same lengths in the contact region.

In some embodiments, the numbers of the plurality of word lines electrically connected to the plurality of contacts are gradually increased from a first boundary of the contact region near the core array region toward a second boundary of the contact region farther from the core array region.

In some embodiments, the heights of the plurality of contacts holes are gradually increased from a first boundary of the contact region near the core array region toward a second boundary of the contact region farther from the core array region.

In some embodiments, the plurality of contacts and the plurality of word lines are composed of same conductive material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
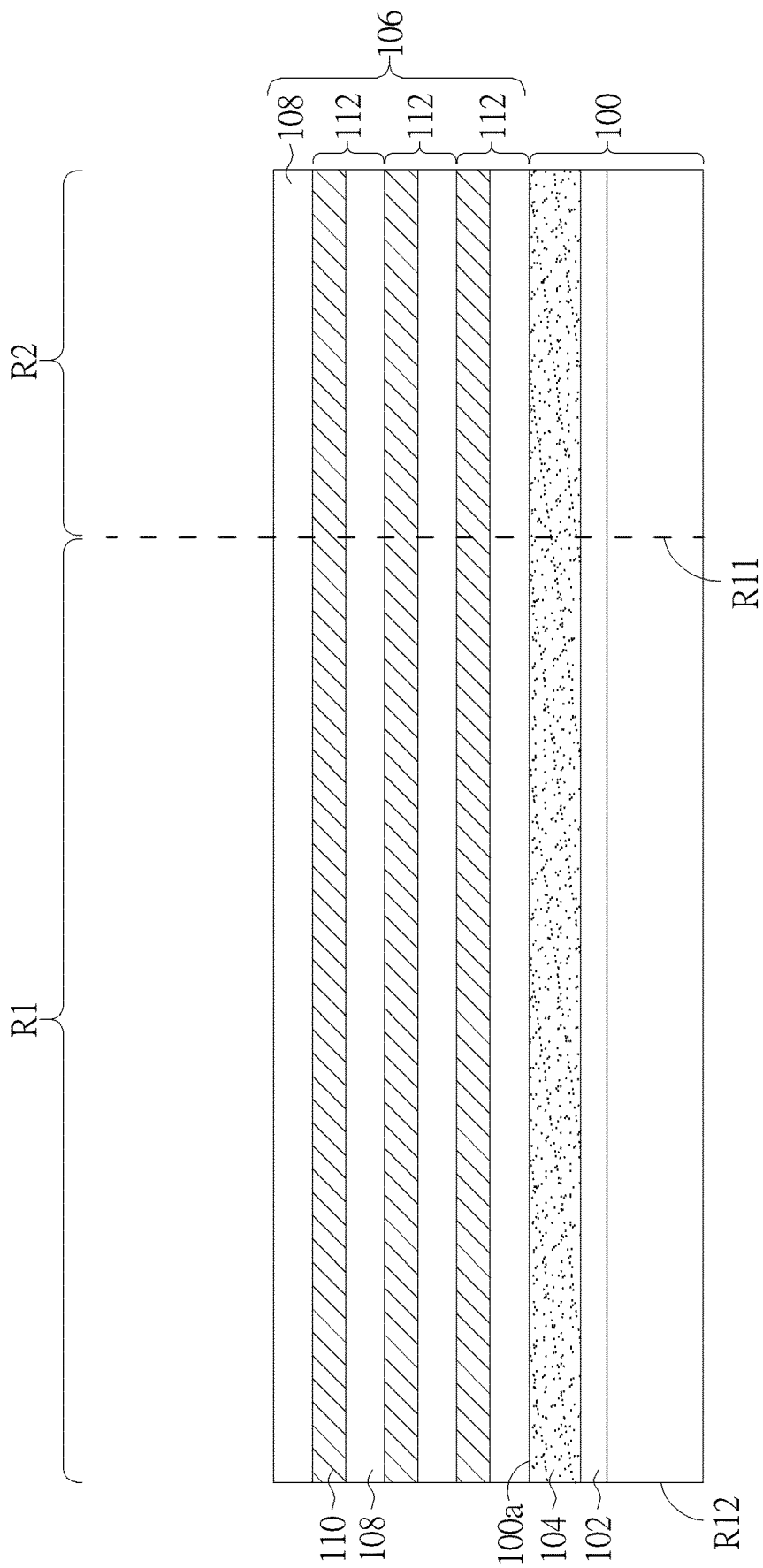
FIG. 1 to FIG. 12 are schematic sectional-diagrams illustrating a fabrication process for forming a 3D memory device according to some embodiments of the present disclosure.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" and "substantial/substantially" refer to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, the term "horizontal/horizontally" means nominally parallel to the lateral surface of a substrate.

3D NAND memory device operations can include reading, programming, and erasing. Frequently applying bias voltage at word lines during these operations can disturb charge trapping in charge-trapping layers which in turn causes disturbance errors and degrades memory device reliability. 3D NAND memory cells may incorporate tunnel field effect transistor (TFET) to provide improved threshold voltage stability during 3D NAND memory device operations such as, reading, programming, and erasing.

In some 3D memory devices, a source selective gate controls the on/off state of a doped silicon channel formed in the substrate of the 3D memory device. The operation speed of the source selective gate depends on the conductance of the silicon channel, which can be limited as silicon is a semiconductor material. Further, as the entire block of memory cells can share a single source selective gate, the load to drive the array common source of the memory block can be challenging for the peripheral device.

Various embodiments in accordance with the present disclosure provide a 3D memory device with a source conductor layer in place of the silicon channel in the substrate used by other 3D memory devices. By replacing silicon with conductive materials (e.g., metal, metal alloy, and/or metal silicide) that form the source conductor layer disclosed herein, the resistance of the source side (e.g., between the common source contact and the NAND strings) of the 3D memory device can be reduced, thereby increasing the device operation speed. In some embodiments, the conduction mechanism for erase operation of the source selective gate can become driven by gate-induced drain leakage (GIDL).

Moreover, compared with silicon substrate, the source conductor layer disclosed herein can be more easily patterned into any suitable layout (e.g., with different isolation regions) for driving a single memory block, multiple memory blocks, or a portion of a memory block as desired, which can enhance the driving capability of the peripheral device for the memory array. Due to its conductive nature, the source conductor layer disclosed herein can be patterned and used as an interconnect layer (e.g., part of the BEOL interconnect).

Figure 12:
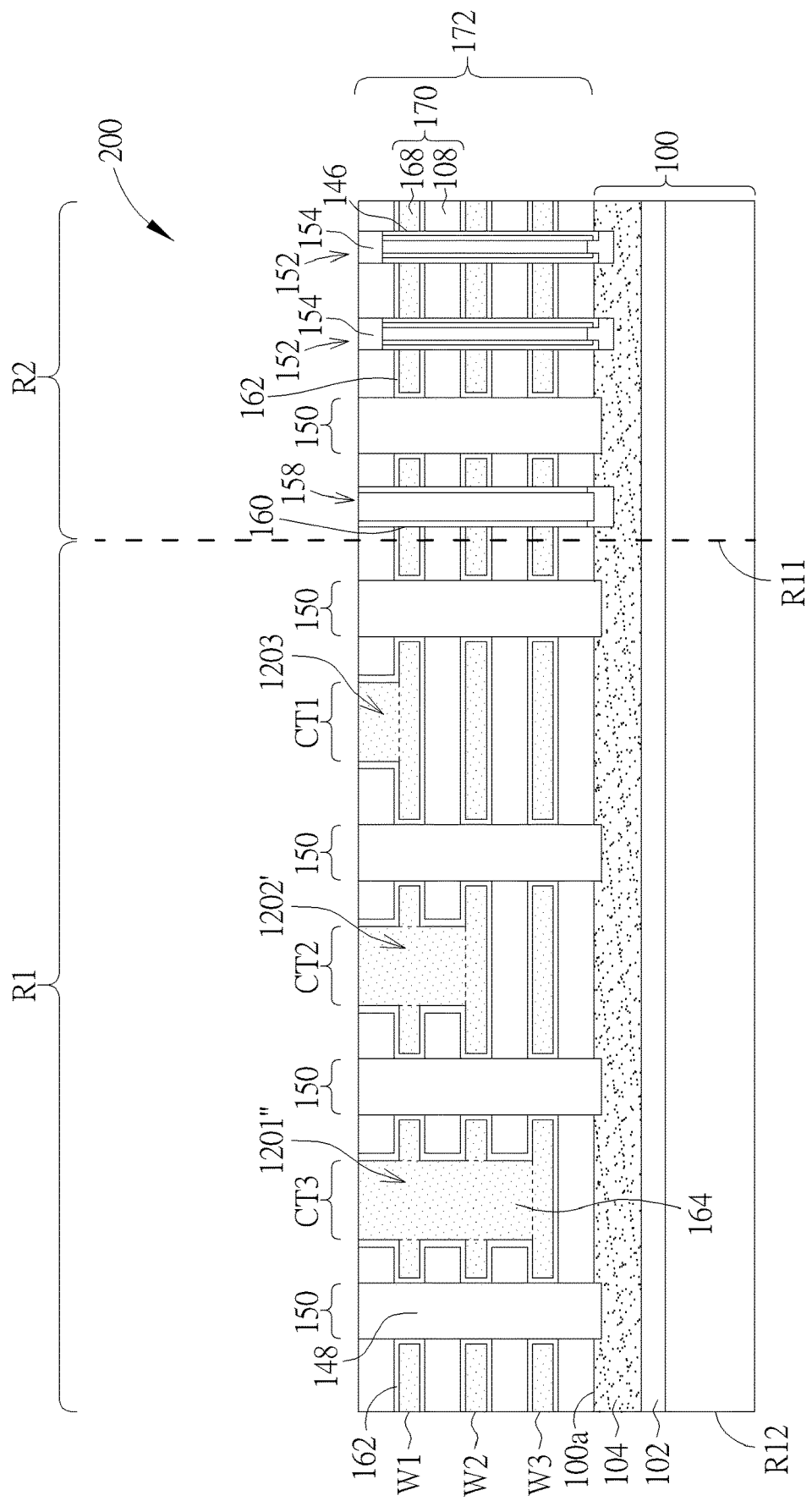
Figure 13:
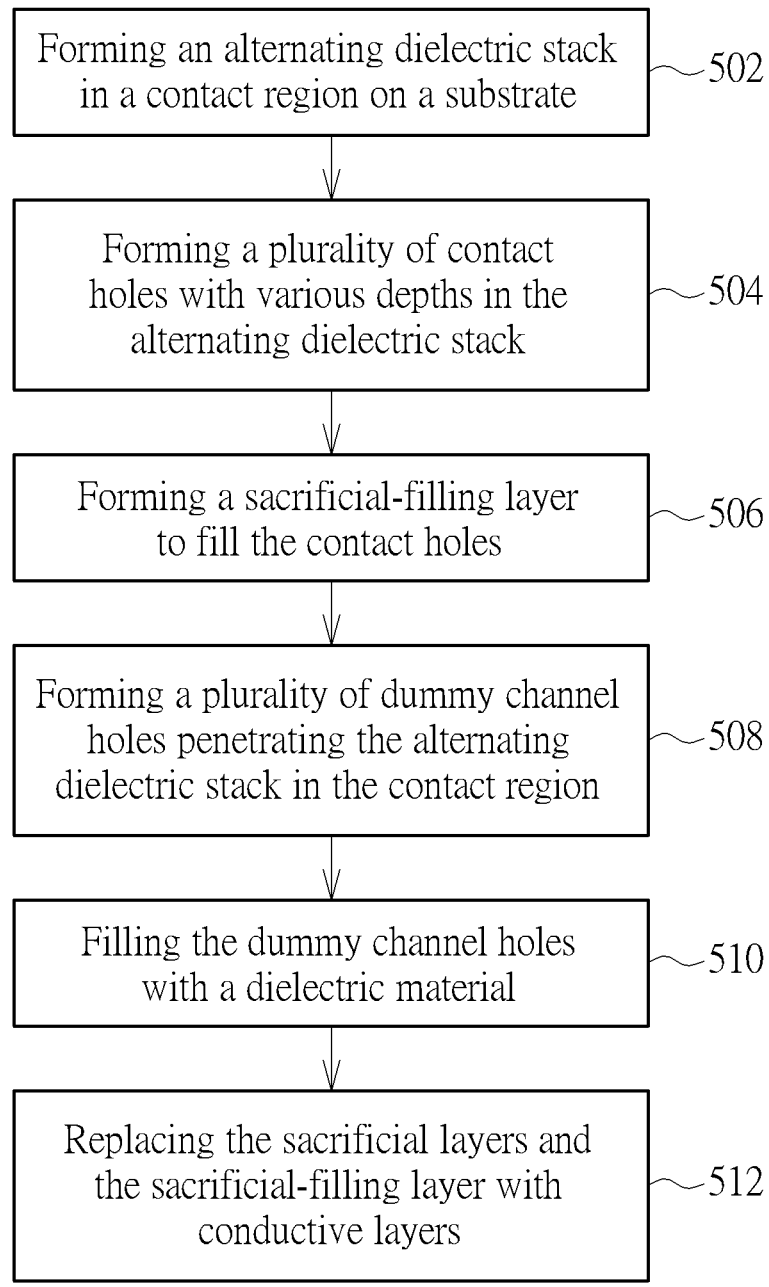
FIG. 13 illustrates a flowchart of a method for forming a 3D memory device according to some embodiments of the present disclosure.
Figure 14:
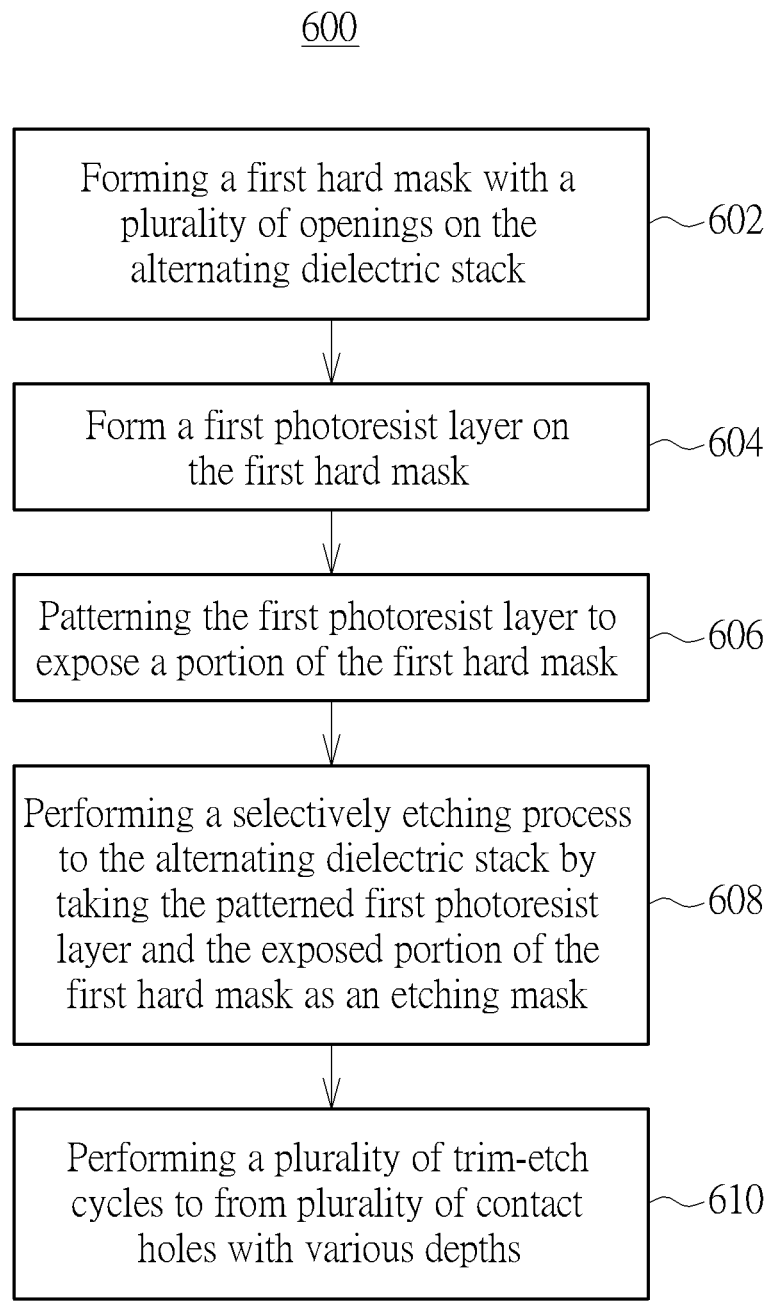
FIG. 14 illustrates a flowchart of a method for forming a plurality of contact holes with various depths according to some embodiments of the present disclosure.

Referring to FIG. 1 to FIG. 14, FIG. 1 to FIG. 12 illustrate a fabrication process for forming a 3D memory device according to some embodiments of the present disclosure, FIG. 13 illustrates a flowchart of a method for forming a 3D memory device according to some embodiments of the present disclosure, and FIG. 14 illustrates a flowchart of a method for forming a plurality of contact holes with various depths according to some embodiments of the present disclosure. Referring to FIG. 13, the method 500 for forming a 3D memory device includes Step 502, in which an alternating dielectric stack is formed in a contact region on a substrate. As shown in FIG. 1, a substrate 100 is provided. The substrate 100 can be any suitable semiconductor substrate having any suitable material and/or structure, such as a monocrystalline silicon single-layer substrate, a polycrystalline silicon (polysilicon) single-layer substrate, a polysilicon and metal multi-layer substrate, a germanium substrate, a silicon germanium (SiGe) substrate, a silicon on insulator (SOI) substrate, a germanium on insulator (GOI) substrate, a gallium arsenide (GaAs) substrate, an Indium phosphide (InP) substrate, a silicon carbide (SiC) substrate, a silicon and silicon germanium (Si/SiGe) multi-layer substrate, a silicon and germanium on insulator (SGOI) multi-layer substrate, etc. In the following description, the substrate 100 is a monocrystalline silicon substrate as an example. The substrate 100 has a top lateral surface 100a.

In some embodiments, a contact region R1 and a core array region R2 can be integrated on the substrate 100. The core array region R2 can be used to form memory cells of 3D memory device, such as 3D NAND device. The contact region R1 can be used to form contacts for electrically connecting the memory cells outwardly. In some embodiments, a peripheral region can also be formed on the substrate 100, which can be used to form one or more peripheral circuits related to the operations of the 3D NAND device. The peripheral circuits can include one or more complementary metal-oxide-semiconductor (CMOS) devices for example.

In this embodiment, a first-type doped region 102 and a second-type doped region 104 are disposed on the surface 100a of the substrate 100. The second-type doped region 104 is disposed above the first-type doped region 102. The first-type doped region 102 has an opposite conductive-polarity type to the second-type doped region 104. The first-type doped region 102 can be a deep well, such as a deep N-type well, and the second-type doped region 104 can be a high-voltage P-type well (HVPW), but not limited thereto.

According to this embodiment, an alternating dielectric stack 106 is formed in the contact region R2 on the substrate 100. The alternating dielectric stack 106 can also be formed in the core array region R1 on the substrate 100. The alternating dielectric stack 106 includes a plurality of dielectric layers 108 and a plurality of sacrificial layers 110 alternately stacked on the substrate 100 along a vertical direction which is perpendicular to the surface 100a of the substrate 100 and perpendicular to the laterally extending direction of the substrate 100. The alternately stacked dielectric layers 108 and sacrificial layers 110 form a plurality of dielectric/sacrificial layer pairs 112 stacking vertically on the substrate 100. A sacrificial layer 110 can be sandwiched by two adjacent dielectric layers 108, and vice versa. In other words, except a top and a bottom layer of a given alternating dielectric/sacrificial stack, each of the other dielectric layers 108 can be sandwiched by two adjacent sacrificial layers 110, and each of the other sacrificial layers 110 can be sandwiched by two adjacent dielectric layers 108. The plurality of dielectric layers 108 and the plurality of sacrificial layers 110 are extended in a lateral direction that is parallel to the surface 100a of the substrate 100. In addition, the dielectric layers 108 and the sacrificial layers 110 can have the same lengths in the contact region R1 along the horizontal (lateral) direction from a first boundary R11 near the core array region R2 to a second boundary R12 farther from the core array region R2.

The alternating dielectric stack 106 can include any suitable number of layers of dielectric layers 108 and sacrificial layers 110. In some embodiments, a total number of layers of dielectric layers 108 and sacrificial layers 110 in the alternating dielectric stack 106 is equal to or larger than 64. That is, a number of the dielectric/sacrificial layer pairs 112 can be equal to or larger than 32. In order to simplify the diagrams, four layers of dielectric layers 108 and three layers of sacrificial layers 110 are shown in the figures for illustration, which are not intended to limit the present disclosure. In some embodiments, the alternating dielectric stack 106 can include more layers of dielectric layers 108 and sacrificial layers 110. In some embodiments, the alternating dielectric stack 106 includes more dielectric layers or more sacrificial layers with different materials and/or thicknesses than the dielectric/sacrificial layer pairs 112.

The alternating dielectric stack 106 can be formed by one or more thin film deposition processes including, but not limited to, chemical vapor deposition (CVD), physical vapor deposition (PVD), atomic layer deposition (ALD), or any combination thereof. In some embodiments, the dielectric layers 108 can each have the same thickness or have different thicknesses. For example, a thickness of each dielectric layer 108 can be in a range from 10 nm to 100 nm, preferably about 30 nm. Similarly, the sacrificial layers 110 can each have the same thickness or have different thicknesses. For example, a thickness of each sacrificial layer can be in a range from 10 nm to 100 nm, preferably about 35 nm. In some embodiments, a top dielectric layer 108 and a bottom dielectric layer 108 of the alternating dielectric stack 106 can have a thickness larger than the thicknesses of other layers in the alternating dielectric stack 106, but not limited thereto. In some embodiments, the top dielectric layer 108 can be used as an isolation layer of top selective gate (i.e., drain selective gate), while the bottom dielectric layer 106 can be used as an isolation layer of bottom selective gate (i.e., source selective gate).

In some embodiments, the dielectric layers 106 may be oxide layers, and the sacrificial layers 108 may be nitride layers, but not limited thereto. It is noted that, in the present disclosure, the dielectric layers 108 and/or sacrificial layers 110 can include any suitable oxide materials and/or nitride materials. For example, the oxide materials can include silicides, and the element of nitride materials can include, but not limited to, tungsten (W), cobalt (Co), copper (Cu), aluminum (Al), doped silicon, silicides, or any combination thereof. In some embodiments, the dielectric layers 108 can be silicon oxide layers, and the sacrificial layers 110 can be silicon nitride layers.

Figure 2:
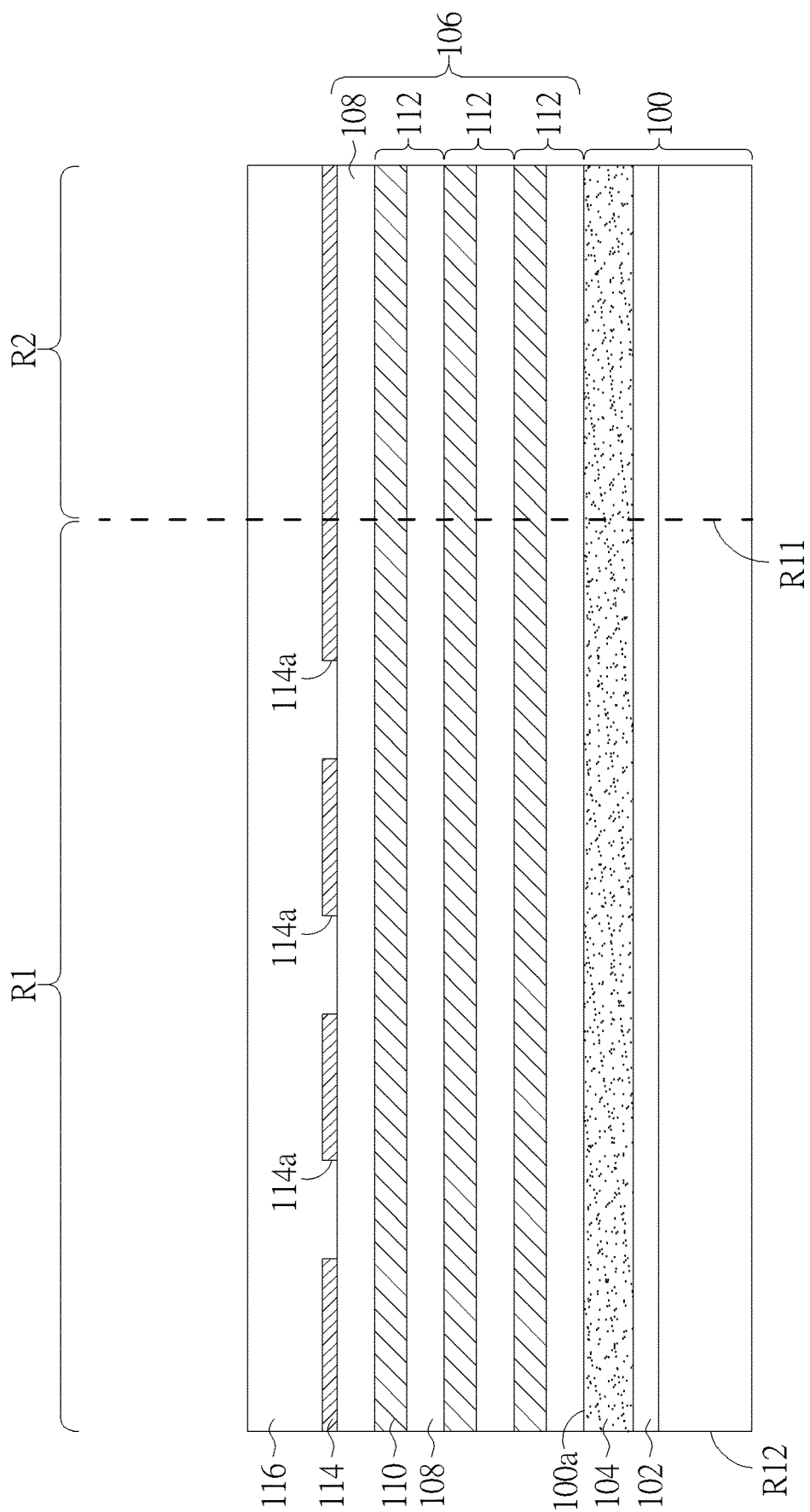

In Step 504 of method 500 shown in FIG. 13, a plurality of contact holes with various depths are formed in the alternating dielectric stack 106. The contact holes with various depths may be formed through procedures. The method 600 of forming the contact holes with various depths is introduced in FIG. 14. As shown in FIG. 14 and FIG. 2, Step 602 of method 600 can be proceeded to form a first hard mask 114 with a plurality of openings 114a on the alternating dielectric stack 206. The plurality of openings 114a can be arranged from the first boundary R11 of the contact region R1 toward the second boundary R12 of the contact region R1 on the alternating dielectric stack 106. The openings 114a are used for defining the predetermined locations and shapes of the contact holes. As an example, the alternating dielectric stack 106 has N+1 layers of the dielectric layers 108 and N layers of the sacrificial dielectric layers 110, and the number of N of the openings 114a can be formed in the contact region R1. The processes to form the openings 114 may include first forming the first hard mask layer 114 blanketly, and then pattering the first hard mask layer 114 to form the openings 114a. The patterning process to the first hard mask layer 114 may be performed through a photolithography-etching process (PEP), and a photoresist layer may be formed on the first hard mask layer 114 before carrying on the PEP.

Figure 3:
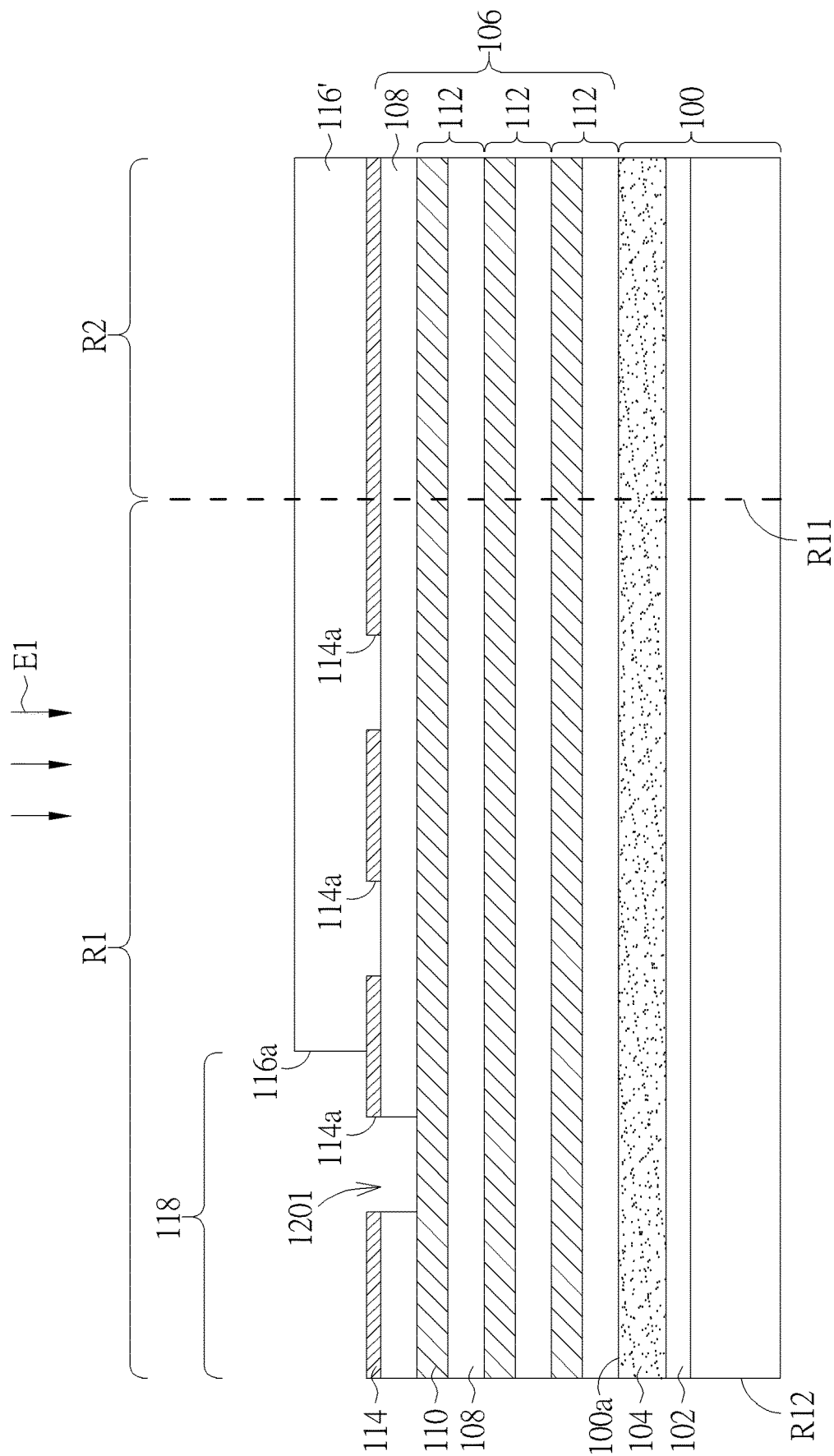

As shown in FIG. 14, in Step 604, a first photoresist layer 116 is formed on the first hard mask 114. The first photoresist layer 116 covers the first hard mask 114 and the openings 114a. Then, Step 606 is performed to patterning the first photoresist layer 116 to expose a portion of the first hard mask 114 and at least one of the openings 114a of the first hard mask 114. As shown in FIG. 3, the patterned photoresist layer 116' has a pattern 116a, and an exposed portion 118 of the first hard mask 114 exposed by the patterned photoresist layer 116' is illustrated. For example, the $N^{th}$ openings 114a that is the closest to the second boundary R12 of the contact region R2 is exposed by the patterned first hard mask 116', while the $1^{st}$ opening 114a to the $(N-1)^{th}$ opening 114a of the first hard mask 114 are still covered by the patterned first photoresist layer 116'.

Then, Step 608 is performed to perform a selectively etching process E1 to the alternating dielectric stack 106 by taking the patterned first photoresist layer 116' and the exposed portion 118 of the first hard mask 114 as an etching mask. The etching process E1 has high etching selectivity ratio of the dielectric layer 108 to the sacrificial layer 110 such that the sacrificial layer 110 positioned below the top dielectric layer 108 can be taken as an etching-stop layer. In other words, the etching process E1 is performed to etch the top dielectric layer 108 exposed by the $N^{th}$ opening 114a of the first hard mask 114 until the top sacrificial layer 110 is exposed. The etching process E1 can be any suitable wet etching or dry etching process. As shown in FIG. 3, a contact hole 1201 with small depth is formed in the top dielectric layer 108.

Figure 4:
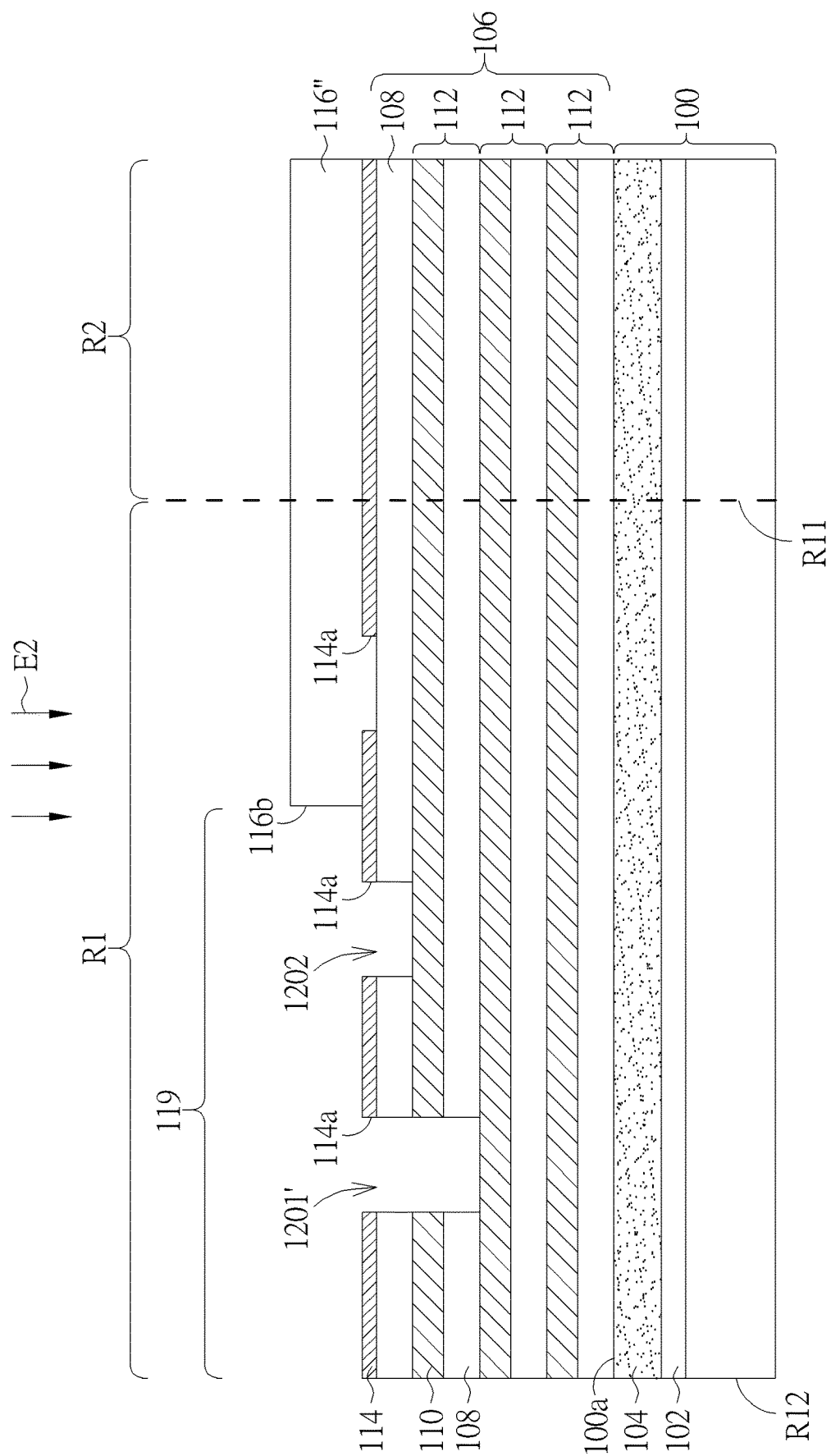

Sequentially, Step 610 in FIG. 14 can be performed, in which a plurality of trim-etch cycles are performed to form the plurality of contact holes with various depths, by trimming the first photoresist layer 116' and etching the plurality of dielectric layers 108 and the sacrificial layers 110 through the openings 114a of the first hard mask 114. The trim-etch cycles includes trimming the first photoresist layer to broaden the exposed portion of the first hard mask and to expose a further opening of the first hard mask; performing an alternating high selectively etching process to the alternating dielectric stack by taking the trimmed first photoresist layer and the broadened exposed portion of the first hard mask as an etching mask; and repeating the plurality of trim-etch cycles composed of trimming the first photoresist layer and performing the alternating high selectively etching process to the alternating dielectric stack until the bottom sacrificial layer is exposed. In detail, as shown in FIG. 4, the patterned photoresist layer 116' shown in FIG. 3 is trimmed and a portion of the photoresist layer 116' is further removed. In other words, the size of the photoresist layer 116' is reduced to form a trimmed photoresist layer 116" with a pattern 116b, so as to expose a further opening 114a of the first hard mask 114 and a further exposed portion 119 of the first hard mask 114, as well as the alternating dielectric stack 106. Then, an alternating high selectively etching process E2 to the alternating dielectric stack 106 is performed, by taking the trimmed first photoresist layer 116" and the exposed portion 119 of the first hard mask 114 as an etching mask. During performing the alternating high selectively etching process E2, a portion of the top sacrificial layer 110 exposed by the $N^{th}$ opening 114a is removed to expose the second top dielectric layer 108, and then a portion of the second top dielectric layer 108 exposed by the $N^{th}$ opening 114a and a portion of the top dielectric layer 108 exposed by the $(N-1)^{th}$ opening 114a are removed, thus a contact hole 1201' and a contact hole 1202 are formed, wherein the contact hole 1201' penetrates the first three top layers of the alternating dielectric stack 106 and the contact hole 1202 penetrates the first top layer of the alternating dielectric stack 106. In other words, the depth of the contact hole 1201' is greater than the depth of the contact hole 1202. The alternating high selectively etching process E2 refers to that the etching process has high selectivity of the sacrificial layers 110 to the dielectric layers 108 in the former period of the etching process and has high selectivity of the dielectric layers 108 to the sacrificial layers 110 in the later period of the etching process. In other words, the alternating high selectively etching process E2 may include two step-etching processes. The first-step etching process removes the exposed portions of the sacrificial layers 110, exposed by the first hard mask 114 and the trimmed first photoresist layer 116", and can stop on the next lower layer (e.g., the second dielectric layer 108). The pattern in the first hard mask 114 is then transferred to the layer (e.g., the top sacrificial layer 110) that has been etched. Then, a second-step etching process can remove the exposed next lower layer (e.g., the second dielectric layer 108) and the exposed top dielectric layer 108 by the openings 114a that is exposed by the trimmed first photoresist layer 116". The second-step etching process can stop on the next lower layers (e.g., the second sacrificial layer 110 and the top sacrificial layer 110 respectively). The alternating high selectively etching process E2 may be any suitable dry/wet etching process, such as a reactive ion etching (RIE) process, but not limited thereto. The trim-etch cycle is composed of trimming the first photoresist layer 116 and performing the alternating high selectively etching process to the alternating dielectric stack 106 as mentioned above.

Figure 5:
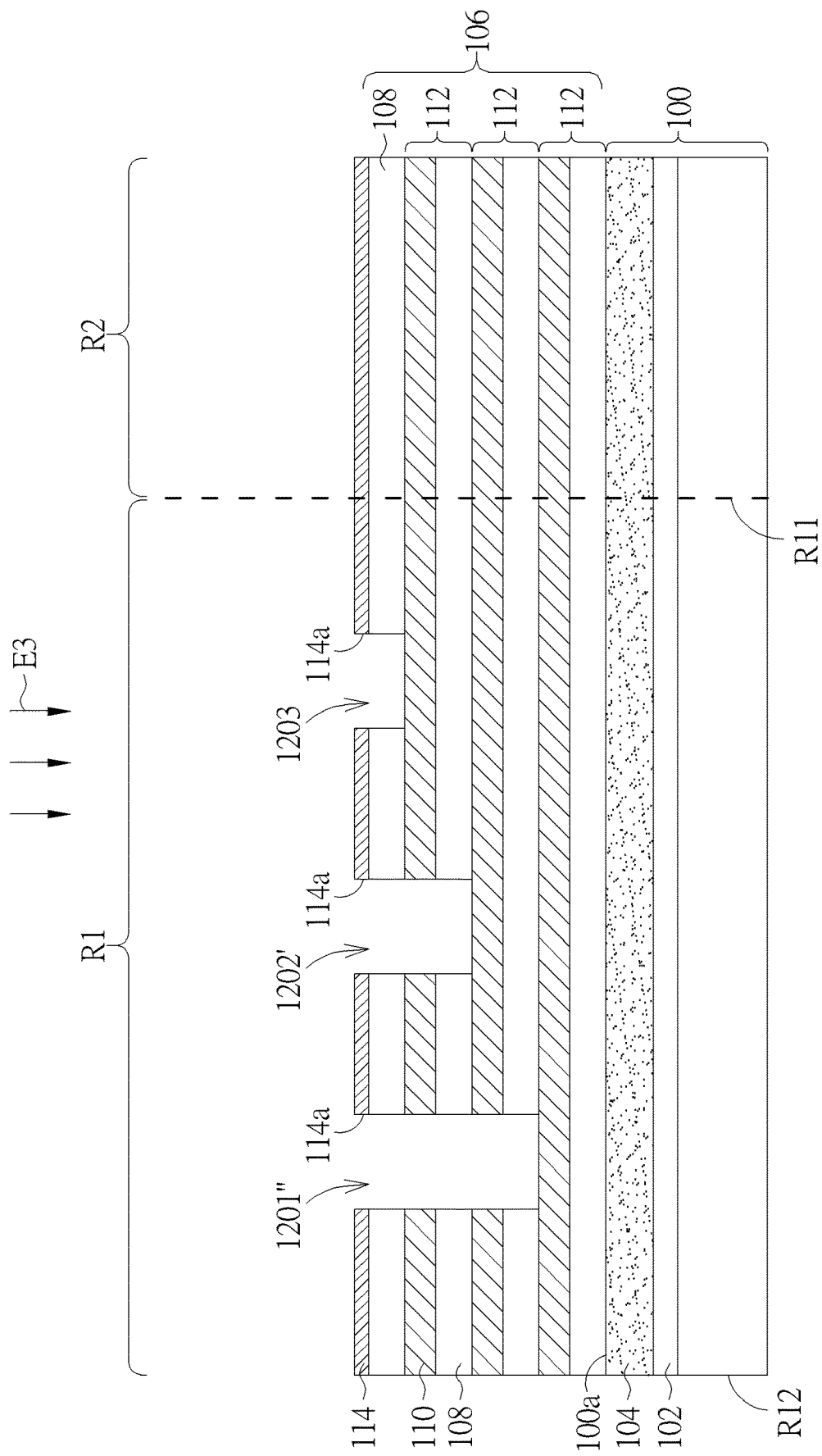

As shown in FIG. 5, a plurality of the trim-etch cycles are repeated until the bottom sacrificial layer 110 is exposed. For example, the first photoresist layer 116" can be further trimmed to reduce its size and expose a further portion of the first hard mask 114 and a further opening 114a (e.g., the $(N-1)^{th}$ opening 114a), and an alternating high selectively etching process E3 is performed, so as to form the contact holes 1201", 1202', 1203. In this embodiments, the contact hole 1201" penetrates the first to the fifth top layers of the alternating dielectric stack 106, the contact hole 1202' penetrates the first to the third top layers of the alternating dielectric stack 106, and the contact hole 1203 penetrates the top layer of the alternating dielectric stack 106. In other words, the contact hole farther from the core array region R2 penetrates more layers of the alternating dielectric stack 106 than the contact hole closer to the core array region R2, and the numbers of the plurality of dielectric layers 108 penetrated by the plurality of contact holes with various depths are gradually increased from the first boundary R11 of the contact region R1 toward the second boundary R12 of the contact region R1. As mentioned above, the trimming-etching cycles are repeated until the bottom sacrificial layer 110 is exposed by the contact hole 1201", thus the plurality of contact holes with various depths are formed. The depths of the contact holes (such as 1201", 1202', 1203) are gradually increased from the first boundary R11 of the contact region R1 toward the second boundary R22 of the contact region R2. In other words, the numbers of the dielectric layers 108 and the sacrificial layers 110 penetrated by the contact holes (such as 1201", 1202', 1203) are gradually increased from the first boundary R11 of the contact region R1 toward the second boundary R22 of the contact region R2. Accordingly, the contact holes 1201", 1202', 1203 with various depths are formed in the alternating dielectric stack 106, which extend vertically in the alternating dielectric stack 106.

Figure 6:
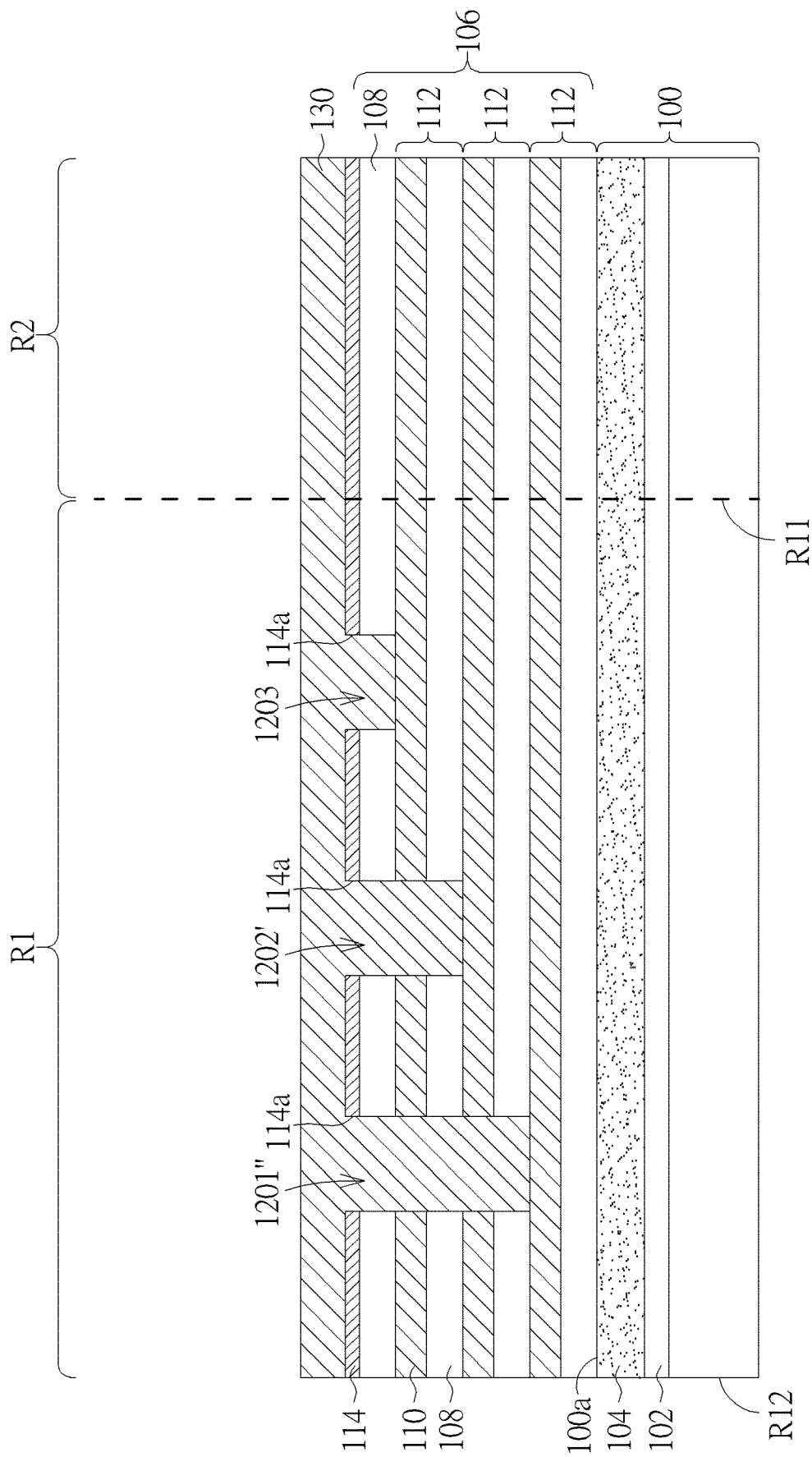

Referring to FIG. 13 and FIG. 6, in Step 506 of method 500, a sacrificial-filling layer 130 is formed to fill the contact holes 1201", 1202', 1203. The sacrificial-filling layer 130 may be formed through a chemical vapor deposition (CVD) process, a physical vapor deposition (PVD) process, or any suitable process. The sacrificial-filling layer 130 may be composed of dielectric material. In some embodiments, the sacrificial-filling layer 130 may include the same or similar material to the sacrificial layers 110. In this embodiment, the sacrificial-filling layer 130 includes nitride material as an example. A portion of the sacrificial-filling layer 130 may be considered as a second hard mask in the following formation processes.

Figure 7:
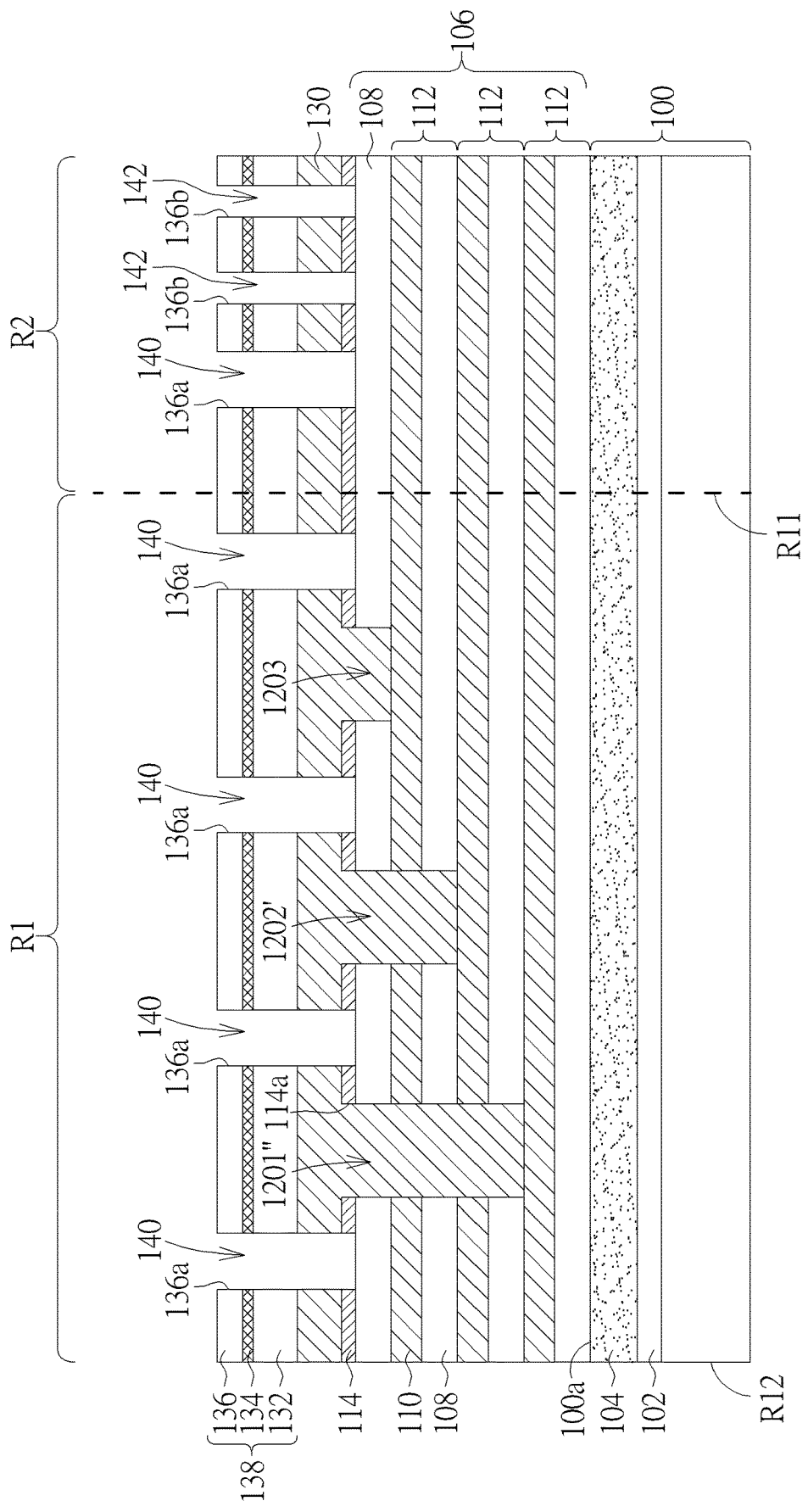
Figure 8:
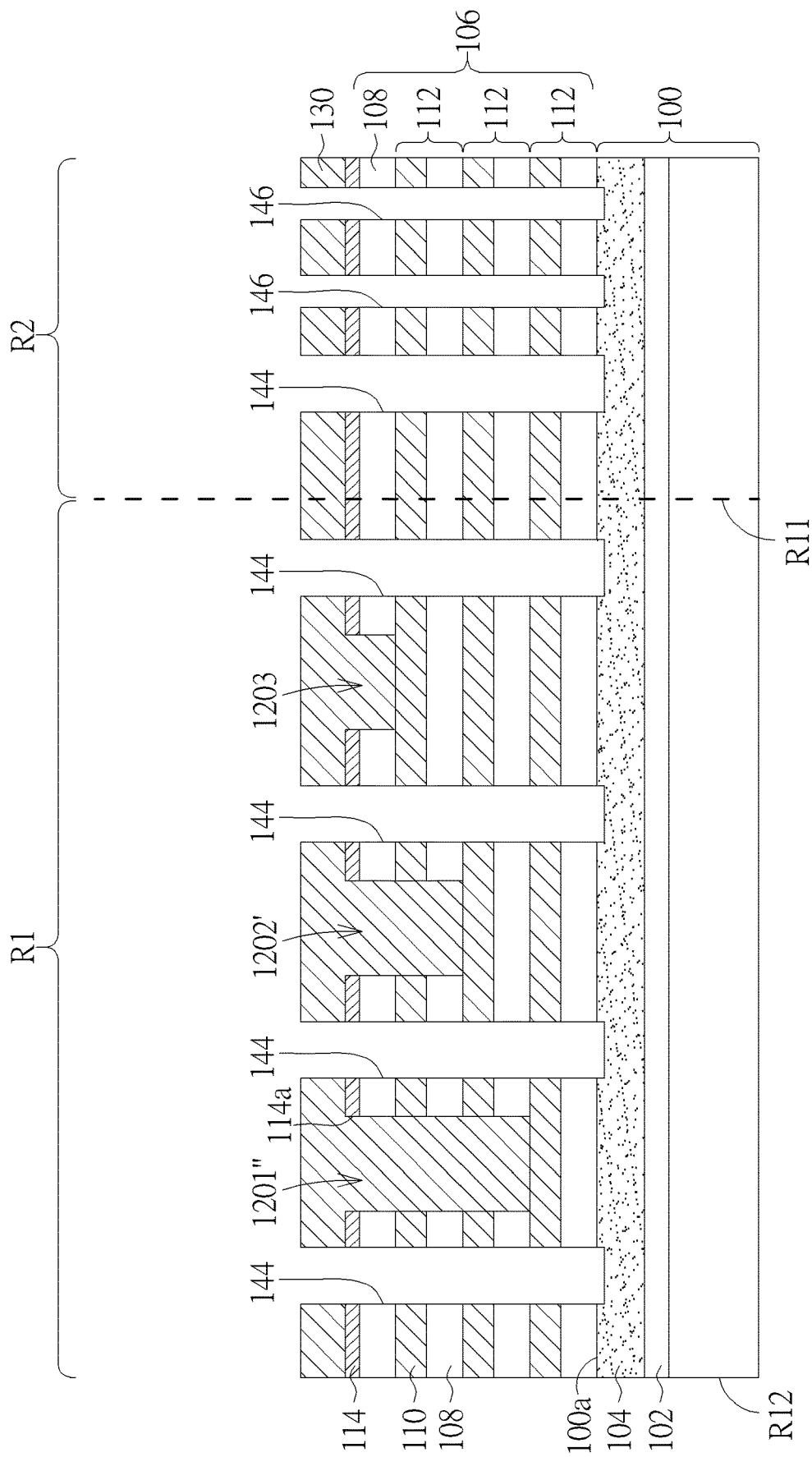

Referring to FIG. 13, in Step 508 of method 500, a plurality of dummy channel holes penetrating the alternating dielectric stack to the substrate in the contact region are formed. In some embodiments, a plurality of channel holes may also be formed in the core array region simultaneously with the dummy channel holes. In some other embodiments, the channel holes may be formed separately from dummy channel holes. FIG. 7 and FIG. 8 illustrate the formation process of the dummy channel holes, together with the channel holes, as an example. As shown in FIG. 7, a patterning layer 138 for defining the locations of the dummy channel holes is formed on the sacrificial-filling layer 130. The patterning layer 138 may have a tri-layer structure, which include a third hard mask 132, an anti-reflection coating (ARC) layer 134, and a second photoresist layer 136 from bottom to top on the sacrificial-filling layer 130. As an example, the third hard mask 132 can include amorphous carbon, the ARC layer 134 can include silicon oxynitride (SiON), and the second photoresist layer 136 can include any suitable photoresist material, such as organic material, but not limited thereto. The second photoresist layer 136 may be patterned first by a photolithography process to form a plurality of openings 136a, 136b. The openings 136a correspond to the predetermined locations of the dummy channel holes, which may be located in the contact region R1 and optionally in the core array region R2. The openings 136b correspond to the predetermined locations of the channel holes, which may be located in the core array region R2. The size of the openings 136a can be greater than the size of the openings 138b, but not limited thereto. Then, the ARC layer 134, the third hard mask 132, and the sacrificial-filling layer 130 are patterned by taking the second photoresist layer 136 as a mask layer. Therefore, the openings 140, 142 are formed in the tri-layer structure of the patterning layer 138 and in the sacrificial-filling layer 130, wherein the openings 140 correspond to the openings 136a, and the openings 142 correspond to the openings 136b. Then, the pattern of the sacrificial-filling layer 130 may be further transferred to the first hard mask 114 by taking the patterned sacrificial-filling layer 130 as the second hard mask. Sequentially, as shown in FIG. 8, the patterning layer 138 is removed (or may be remained in some embodiments), and a further etching process is performed to the alternating dielectric stack 106 by taking the patterned sacrificial-filling layer 130 or the first hard mask 114 as an etching mask to remove the portions of the dielectric layers 108 and the sacrificial layers 110 exposed by the openings 140, 142 until the substrate 100 is exposed, so as to form the dummy channel holes 144 in the contact region R1 and the core array region R2 and the channel holes 146 in the core array region R2. The etching process may be any suitable dry/wet etching process, such as a reactive ion etching (RIE) process, but not limited thereto. The dummy channel holes 144 and the channel holes 146 gouges into the top portion of the substrate 110 (e.g., the second-type doped region 104), and the bottoms of the dummy channel holes 144 and the channel holes 146 are lower than the top surface 100a of the substrate 100. In this embodiment, some dummy channel holes 144 are disposed between two adjacent contact holes (e.g., contact holes 1201", 1202', 1203). In some embodiments, the portion of the sacrificial-filling layer 130 above the first hard mask 114 is remained when the dummy holes 144 are formed. In some embodiments, the portion of the sacrificial-filling layer 130 above the first hard mask 114 is removed when the dummy holes 144 are formed.

Figure 9:
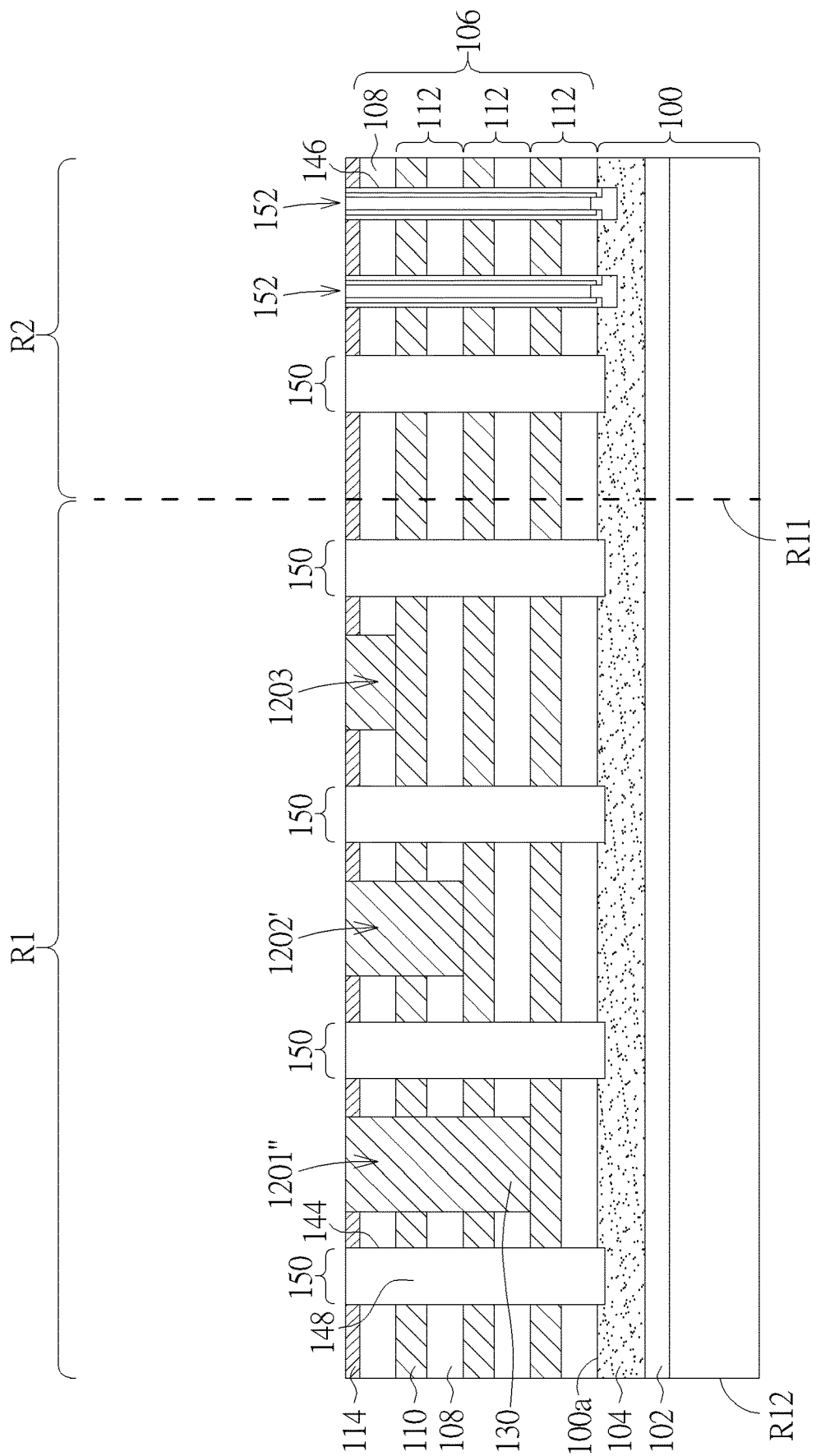

Referring to FIG. 9, in Step 510, a dielectric material 148 is filled into the dummy channel holes 144 to form supporters 150 in the dummy channel holes 144. The dielectric material 148 included the material different from the sacrificial-filling layer 130 and the sacrificial layer 110. In this embodiment, the dielectric material 150 may be oxide material, but not limited thereto. The channel holes 146 are filled with composite layers to form memory strings 152, such as NAND strings. Each memory string 152 can have a cylinder shape (e.g., a pillar shape). In some embodiments, the composite layers of one memory string 152 can include a channel layer, a tunneling layer, a storage layer (also known as a "charge trap layer"), and a blocking layer arranged radially from the center toward the outer surface of the pillar in this order. The channel layer can include silicon, such as amorphous silicon, polysilicon, or single crystalline silicon. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In some embodiments, a central dielectric layer is further formed in the center of the channel holes 146, surrounded by the channel layer. The central dielectric layer can include oxide material or any suitable layer. Accordingly, in some embodiments, the memory strings 152 can have a composite-layer structure of ONOPO (oxide-nitride-oxide-polysilicon-oxide) from the outer-side to the center of the channel holes 146. In some embodiments, an epitaxial layer can be formed at the bottom of each channel hole 146 to serve as a source line selector (SLS) of the memory string 152, before forming the memory strings 152. The source line selector used herein can be also referred to "lower selector" or "bottom selector." After forming the memory strings 152, a CMP process can be performed to remove the portion of the sacrificial-filling layer 130 above the first hard mask 114, wherein the first hard mask 114 can be taken as the polishing stop layer.

Figure 10:
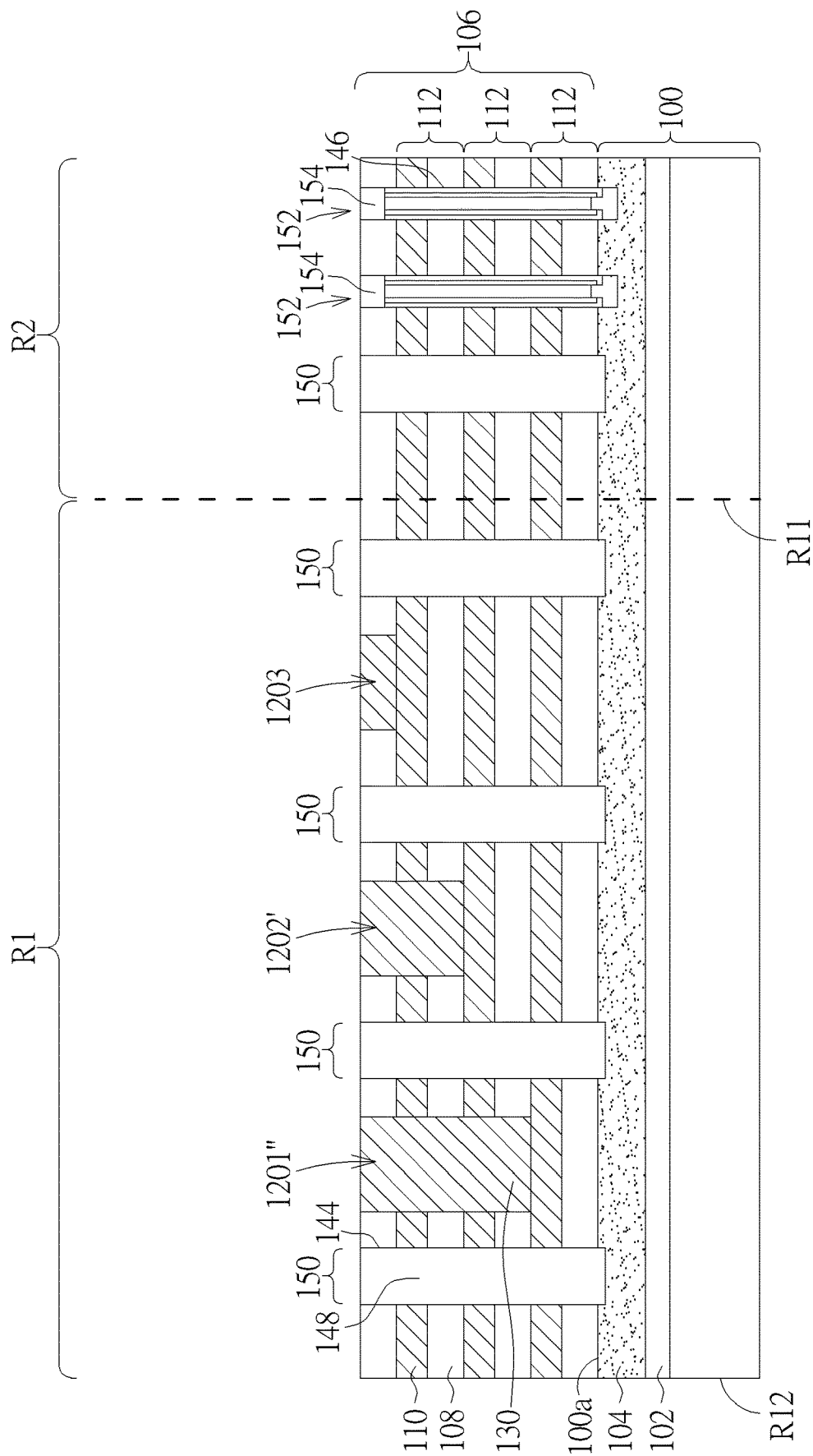

Referring to FIG. 10, the top portion of the memory string structure can be removed to form a recess in the top side of each channel hole 146. For example, the removal of the top portion of the memory string structure can be carried out by a wet etching process, but not limited thereto. Then, a conductive material may be formed in the recess, so as to form channel plugs 154. The conductive material can include doped or un-doped polysilicon or any suitable material. Then, the first hard mask 114 is removed. For example, a wet etching process or a CMP process can be performed for removing the first hard mask 114.

Figure 11:
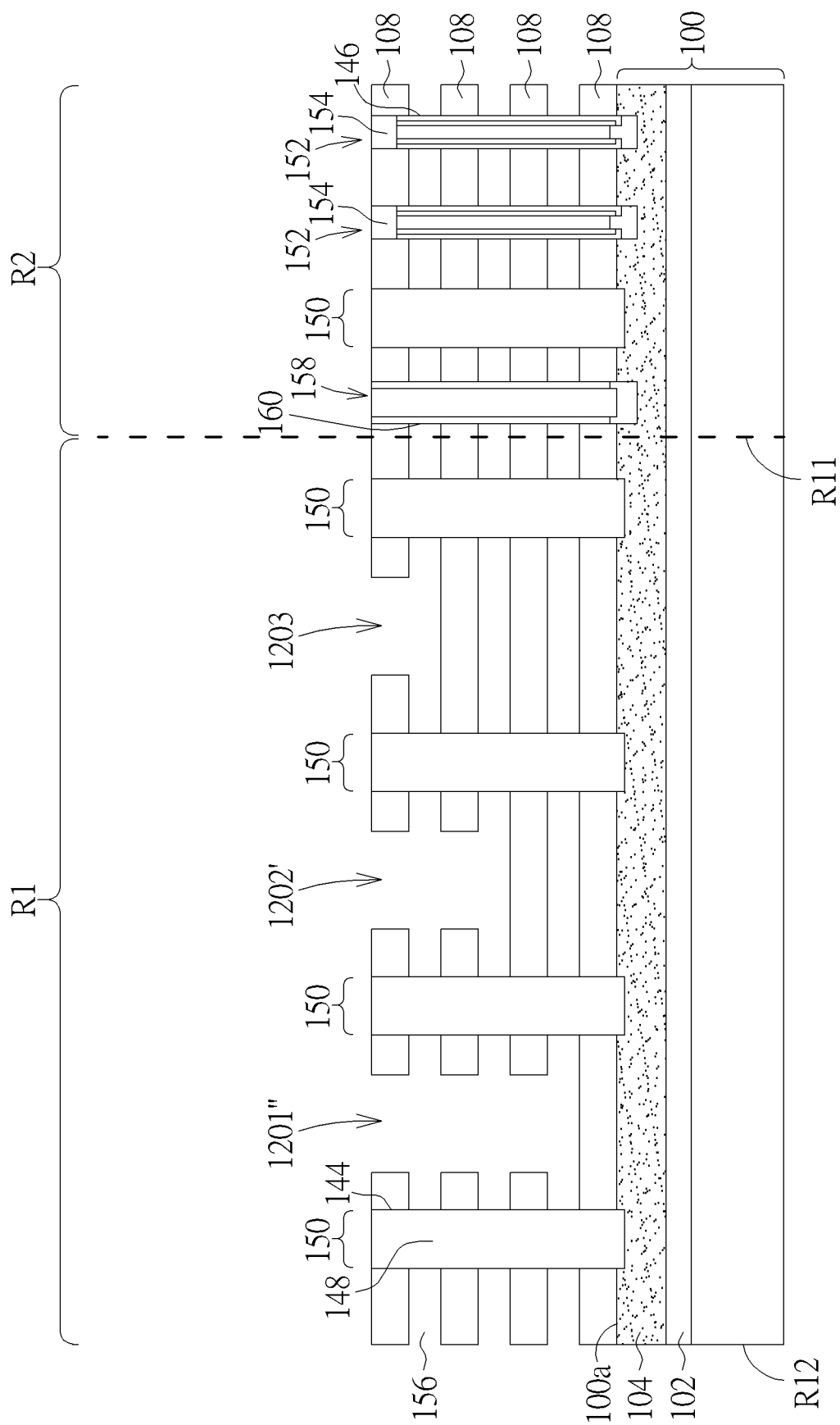

Referring to FIG. 11, a gate line slit (GLS) 160 can be formed by etching a portion of the alternating dielectric stack 106 in the core array region R2. Then, a GLS structure 158 can be formed in the GLS 160. In some embodiments, a dielectric layer (such as silicon oxide, silicon nitride, or any combination thereof) may be formed in the GLS 160, and then the GLS 160 may be filled with a conductive and/or semiconductor material, such as tungsten (W), cobalt (Co), polysilicon or any combination thereof, so as to form the GLS structure 158 for electrically control an array common source (ACS).

Then, Step 512 of method 500 is performed to replace the sacrificial layers 110 and the sacrificial-filling layer 130 with conductive layers 168, 164 (shown in FIG. 12) so as to form a plurality of gate lines and contacts of the 3D memory device 200. Specifically, as shown in FIG. 11, the replacement method of the sacrificial layers 110 and the sacrificial-filling layer 130 with the conductor layers 168, 164 includes removing the sacrificial layers 110 and the sacrificial-filling layer 130 at first to form a plurality of gaps 156 between the adjacent dielectric layers 110 and the supporters 150 in the contact holes 1201", 1202', 1203. The gaps 156 have a plurality of top openings in the top dielectric layer 108. The removal of the sacrificial layers 110 and the sacrificial-filling layer 130 can be performed by wet/dry etch of the sacrificial layers 110 and the sacrificial-filling layer 130 selective to the dielectric layers 108. Then, referring to FIG. 12, a conductive material can be filled into the gaps 156 between the adjacent dielectric layers 110 and the supporters 150 downward through the top openings of the gaps 156, thus a plurality of conductive layers 168, 164 are formed. The conductive layers 168, 164 can include conductive materials including, but not limited to, W, Co, Cu, Al, doped silicon, polysilicon, silicides, or any combination thereof. The conductive layers 168, 164 can be filled by thin film deposition processes, such as CVD, ALD, any other suitable process, or any combination thereof. After filling the conductive layers 168, 164, a plurality of word lines (i.e. gate lines, such as the word lines W1, W2, W3) extending laterally along the surface 100a of the substrate 100 are formed in the gas 156 between the adjacent dielectric layers 108. Each word lines W1, W2, W3 are sandwiched between two adjacent dielectric layers 108 in the vertical direction perpendicular to the surface 100a of the substrate 100. Accordingly, each conductive layer 168 and an adjacent dielectric layer 108 form a conductor/dielectric pair 170, and the conductor/dielectric pairs 170 stacked vertically on the substrate 100 form an alternating conductor/dielectric stack 172. In addition, the conductive layers 164 filled in the contact holes 1201'', 1202', 1203 respectively form a plurality of contacts CT3, CT2, CT1 with various heights, which corresponds to the depths of the contact holes 1201'', 1202', 1203. Accordingly, the word lines W1, W2, W3 and the contacts CT1, CT2, CT3 of the 3D memory device 200 are formed at the same time. The contacts CT1, CT2, CT3 can be used for electrically connecting the word lines W1, W2, W3 outward from the core array region R2. The heights of the contacts CT3, CT2, CT1 are gradually increased from the first boundary R11 to the second boundary R12 of the contact region R1. As a result, the numbers of the word lines W1, W2, W3 connected by the contacts CT3, CT2, CT1 are gradually increased from the first boundary R11 to the second boundary R12 of the contact region R1. In detail, the contact CT1 is connected to one single word line, the first top word line W1; the contact CT2 is connected to the first and second top word lines W1, W2; and the contact CT3 is connected to three word lines W1, W2, W3. In this embodiments, the numbers of the word lines connected by the contacts ($NCT_n$) can be represented by the following equation:

$$NCT_n = \sum_{i=1}^{n} WL_i.$$

In this design, the word lines can be electrically connected outwards by the contacts, and the disclosed structure can provide a functionality of fast reading of word line resistance/connection.

In addition, before forming the conductive layers 168, 164, a high-k layer, a glue layer and/or a barrier layer may be formed on the surfaces of the gaps 156. In FIG. 12, a high-k layer 162 is shown for illustration. The high-k layer 162 (or the glue layer/barrier layer) is positioned between the conductive layers 168, 164 and the dielectric layers 108 and the supporters 150, and can be formed by ALD process, thermal growth process or any suitable process. The high-k layer can include $Al_2O_3$, $HfO_2$, or $Ta_2O_5$ for example, and the glue layer or barrier layer can include Ti/TiN/TaN for example, but not limited thereto. In some embodiments, the GLS structure 158 can be formed before forming the conductive layers 168, 164. In some embodiments, the GLS structure 158 can be formed after the replacement of the sacrificial layers 110 and the sacrificial-filling layers 130 with the conductive layers 168, 164, which means the GLS structure 158 can be formed after the formation of the word lines W1, W2, W3 and the contacts CT1, CT2, CT3. In the embodiments that the GLS structure 158 is formed after forming the conductive layers 18, 164 (word lines and the contacts), the formation process includes: successively forming the GLS 160, removing the sacrificial-filling layers 130 and the sacrificial layer 110 to form the gaps 156, filling high-k/glue/barrier material and conductive material in the gaps 156 to form word lines and contacts, depositing spacer (such as oxide) in the GLS 160, and filling conductive material (such as polysilicon or W) into the GLS 160 to form ACS of the GLS structure 158. In this case, the high-k/glue/barrier material and the conductive material can be filled in the gaps 156 through the GLS 160 laterally in order to form the word lines and contacts.

In some embodiments, as shown in FIG. 12, the structure of a 3D memory device (e.g., 3D memory device 200) is disclosed. The 3D memory device includes a substrate (e.g., substrate 100) having a contact region and a core array region, an alternating conductor/dielectric stack (e.g., alternating conductor/dielectric stack 170) disposed on the substrate 100, a plurality memory strings (e.g., memory strings 152) penetrating the alternating conductor/dielectric stack in the core array region, and a plurality of contacts (e.g., contacts CT1, CT2, CT3) with various heights extending vertically in the alternating conductor/dielectric stack and in the contact region. The alternating conductor/dielectric stack 170 includes a plurality of word lines (e.g., word lines W1, W2, W3) extending laterally from the core array region to the contact region. The number of the word lines electrically connected to one of the contacts is different from the number of the word lines electrically connected to another one of the contacts. The contacts with various heights extend vertically in the alternating conductor/dielectric stack and in the contact region to pass through one or more of the plurality of word lines. Each of the contacts is electrically connected to one or more of the plurality of word lines that are passed through by the contact.

In some embodiments, the plurality of word lines have nominally the same lengths in the contact region. The lengths of the word lines may refer to the dimensions of the word lines along the lateral direction from a first boundary of the contact region near the core array region to a second boundary of the contact region farther from the core array region.

In some embodiments, the number of the word lines electrically connected the contacts are gradually increased from a first boundary of the contact region near the core array region toward a second boundary of the contact region far from core array region.

In some embodiments, the heights of the contacts holes are gradually increased from a first boundary of the contact region near the core array region toward a second boundary of the contact region farther from core array region.

In some embodiments, the contacts and the word lines are composed of the same conductive materials.

According to the present disclosure, the contact holes with various depths can be formed in the contact region for electrically connecting various numbers of word lines. Therefore, conventional staircase structure is not needed to be fabricated from the alternating conductor/dielectric stack for electrically connecting the word lines outwardly. As a result, the complex formation process of conventional staircase structure can be replaced by simpler process, which may bring the advantages of saving cost and higher productive throughput, and the problem for consisting CD and alignment with staircase to contact holes in the formation process of conventional staircase structure can be resolved. In another aspect, the defects of under-etching, over-etching, and/or misalignment that occur in the conventional formation of staircase may be avoided. The formation of the contact holes of the present disclosure can provide self-aligned effect, thus smaller contact pitches can be designed and the total contact region can be reduced. In addition, the word lines and the contacts can be formed at the same time to save the process costs.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming 3D memory device, comprising:
    forming an alternating dielectric stack in a contact region on a substrate, the alternating dielectric stack comprising a plurality of dielectric layers and a plurality of sacrificial layers alternately stacked in a vertical direction that is perpendicular to a surface of the substrate;
    forming a plurality of contact holes with various depths vertically extending in the alternating dielectric stack, the depths of the plurality of contact holes being gradually increased from a first boundary of the contact region toward a second boundary of the contact region;
    forming a sacrificial-filling layer to fill the contact holes;
    forming a plurality of dummy channel holes penetrating the alternating dielectric stack in the contact region;
    filling the dummy channel holes with a dielectric material to form supporters; and
    replacing the sacrificial layers and the sacrificial-filling layer with conductive layers so as to form a plurality of gate lines and a plurality of contacts,
    wherein forming the plurality of contact holes with various depths comprises:
        forming a hard mask with a plurality of openings arranged from the first boundary of the contact region toward the second boundary of the contact region on the alternating dielectric stack;
        forming a photoresist layer on the hard mask;
        patterning the photoresist layer to expose a portion of the hard mask and one of the openings of the hard mask;
        performing a selectively etching process to the alternating dielectric stack by taking the photoresist layer and the exposed portion of the hard mask as an etching mask; and
        performing a plurality of trim-etch cycles by trimming the photoresist layer and etching the plurality of dielectric layers and sacrificial layers through the openings of the hard mask.

2. The method for forming 3D memory device according to claim 1, wherein performing the plurality of trim-etch cycles comprises:
    trimming the photoresist layer to broaden an exposed portion of the hard mask and to expose a further opening of the hard mask;
    performing an alternating high selectively etching process to the alternating dielectric stack by taking the trimmed photoresist layer and the exposed portion of the hard mask as an etching mask; and
    repeating the plurality of trim-etch cycles composed of trimming the photoresist layer and performing the alternating high selectively etching process to the alternating dielectric stack until a bottom sacrificial layer of the plurality of sacrificial layers is exposed.

3. The method for forming 3D memory device according to claim 1, wherein the alternating dielectric stack includes N+1 layers of the dielectric layer and N layers of the sacrificial layers, and the hard mask has a number N of the openings.

4. The method for forming 3D memory device according to claim 1, wherein numbers of the plurality of dielectric layers penetrated by the plurality of contact holes with various depths are gradually increased from the first boundary of the contact region toward the second boundary of the contact region.

5. The method for forming 3D memory device according to claim 1, wherein when forming the plurality of contact holes, the plurality of dielectric layers and the plurality of sacrificial layers have same lengths along a lateral direction from the first boundary of the contact region toward the second boundary of the contact region.

6. The method for forming 3D memory device according to claim 1, wherein replacing the sacrificial layers and the sacrificial-filling layer with the conductive layers comprises:
    removing the sacrificial layers and the sacrificial-filling layer to form a plurality of gaps between the plurality of dielectric layers and the supporters, wherein the plurality of gaps have a plurality of top openings; and
    filling a conductive material into the plurality of gaps downward through the plurality of top openings.

7. The method for forming 3D memory device according to claim 6, further comprising forming a high-K layer, a glue layer, or a barrier layer on surfaces of the plurality of gaps before filling the conductive material into the plurality of gaps.

8. The method for forming 3D memory device according to claim 1, wherein replacing the sacrificial layers and the sacrificial-filling layer with the conductive layers comprises:
    forming a gate line slit in the core array region, wherein the gate line slit vertically extends through the alternating dielectric stack to the substrate before removing the sacrificial layers and the sacrificial-filling layer;
    removing the sacrificial layers and the sacrificial-filling layer to form a plurality of gaps between the plurality of dielectric layers and the supporters; and
    filling a conductive material into the plurality of gaps through the gate line slit laterally.

9. The method for forming 3D memory device according to claim 1, wherein one of the plurality of dummy channel holes is disposed between two of the plurality of contact holes adjacent to each other.

10. The method for forming 3D memory device according to claim 1, wherein a bottom portion of each of the plurality of dummy channel holes is lower than the surface of the substrate.

11. The method for forming 3D memory device according to claim 1, further comprising forming a plurality of channel holes penetrating the alternating dielectric stack in a core array region of the substrate after forming the sacrificial-filling layer.

12. The method for forming 3D memory device according to claim 11, wherein the plurality of channel holes and the plurality of dummy channel holes are formed simultaneously.

13. The method for forming 3D memory device according to claim 11, wherein a memory string is formed in each of the plurality of channel holes.

14. The method for forming 3D memory device according to claim 11, wherein a gate line slit structure is formed in the core array region.

15. The method for forming 3D memory device according to claim 1, wherein the substrate comprises a first-type deep well and a second-type well on the first-type deep well.

16. A 3D memory device, comprising:
a substrate having a contact region and a core array region;
an alternating conductor/dielectric stack disposed on the substrate, the alternating conductor/dielectric stack including a plurality of word lines extending laterally from the core array region to the contact region;
a plurality memory strings penetrating the alternating conductor/dielectric stack in the core array region; and
a plurality of contacts with various heights extending vertically in the alternating conductor/dielectric stack and in the contact region,
wherein a number of the plurality of word lines electrically connected to one of the plurality of contacts is different from a number of the plurality of word lines electrically connected to another one of the plurality of contacts.

17. The 3D memory device according to claim 16, wherein the plurality of word lines have same lengths in the contact region.

18. The 3D memory device according to claim 16, wherein numbers of the plurality of word lines electrically connected to the plurality of contacts are gradually increased from a first boundary of the contact region near the core array region toward a second boundary of the contact region farther from the core array region.

19. The 3D memory device according to claim 16, wherein the heights of the plurality of contacts holes are gradually increased from a first boundary of the contact region near the core array region toward a second boundary of the contact region farther from the core array region.

20. The 3D memory device according to claim 16, wherein the plurality of contacts and the plurality of word lines are composed of same conductive material.

21. A 3D memory device, comprising:
a substrate having a contact region and a core array region;
an alternating conductor/dielectric stack disposed on the substrate, the alternating conductor/dielectric stack including a plurality of word lines extending laterally from the core array region to the contact region;
a plurality memory strings penetrating the alternating conductor/dielectric stack in the core array region; and
a plurality of contacts with various heights extending vertically in the alternating conductor/dielectric stack and in the contact region to pass through one or more of the plurality of word lines, wherein one of the plurality of contacts is electrically connected to two or more of the plurality of word lines that are passed through by the contact.

22. The 3D memory device according to claim 21, wherein the plurality of word lines have same lengths in the contact region.

23. The 3D memory device according to claim 21, wherein numbers of the plurality of word lines electrically connected to the plurality of contacts are gradually increased from a first boundary of the contact region near the core array region toward a second boundary of the contact region farther from the core array region.

24. The 3D memory device according to claim 21, wherein the heights of the plurality of contacts holes are gradually increased from a first boundary of the contact region near the core array region toward a second boundary of the contact region farther from the core array region.

25. The 3D memory device according to claim 21, wherein the plurality of contacts and the plurality of word lines are composed of same conductive material.

* * * * *